United States Patent [19]

Ohtomo et al.

[11] Patent Number: 5,786,593
[45] Date of Patent: Jul. 28, 1998

[54] ROTARY ENCODER HAVING A PLURALITY OF PATTERNS WITH DIFFERENT CYCLES

[75] Inventors: Fumio Ohtomo; Kaoru Kumagai, both of Tokyo, Japan

[73] Assignee: Kabushiki Kaisha Topcon, Tokyo, Japan

[21] Appl. No.: 717,912

[22] Filed: Sep. 23, 1996

[30] Foreign Application Priority Data

Sep. 24, 1995 [JP] Japan .................................. 7-269162

[51] Int. Cl.⁶ .................................................. G01D 5/34
[52] U.S. Cl. ........................ 250/231.14; 250/231.16; 250/237; 341/13
[58] Field of Search .................. 250/231.14, 231.16, 250/237 G; 341/13, 31; 356/373

[56] References Cited

U.S. PATENT DOCUMENTS 4,623,790  11/1986  Stossel .................. 250/231.16

*Primary Examiner*—Stephone B. Allen
*Attorney, Agent, or Firm*—Foley & Lardner

[57] ABSTRACT

The present invention relates to a rotary encoder for detecting an angle and more particularly to a rotary encoder having a scale with a plurality of patterns of different cycles formed on the rotor thereof and capable of precisely measuring the angle of the rotor by reading the scale. The rotary encoder is made up of a rotor and a stator. A scale formed on the rotor has a first pattern modulated for a first period and a second pattern modulated for a second period different from the first period and the first pattern and the second pattern are sequentially disposed at equal pitch in the rotating direction of the rotor, and, further, there is provided a scale detection means for reading the patterns of the scale. Modulation of the first pattern and the second pattern may be made by spatial modulation exercised by changing the width of the bars in the scale.

16 Claims, 8 Drawing Sheets

— EQUAL PITCH

R(O) R(I) ------
A(O) A(I) ———
B(O) B(I) -------

ROTARY ENCODER HAVING A PLURALITY OF PATTERNS WITH DIFFERENT CYCLES

BACKGROUND OF THE INVENTION

The present invention relates to a rotary encoder for detecting an angle and more particularly to a rotary encoder having a scale with a plurality of patterns of different cycles formed on the rotor thereof and capable of precisely measuring the angle of the rotor by reading the scale.

So far, encoders are widely known as instruments to measure an angle electrically. There are encoders of various types such as optical and magnetic types but their basic structures are analogous to each other.

The rotary encoders have been widely used as instruments to measure an angle electrically. Optical encoders, in particular, are produced with high optical technology applied thereto and have features such that they can provide encoders with high precision and high resolution and are invulnerable to external noises such as magnetism and, because of their workings of a noncontact type, they have a long service life.

On account of these excellent characteristics, the optical encoder is used, for example, in a surveying instrument for detecting an angle.

In the optical encoders used in surveying instruments today, there are two types, i.e., the absolute type and the incremental type.

The absolute type is such a type in which the value of an angle and a position on the circumference are in one-to-one correspondence. Since a position on the circumference is registered as an absolute address, it has such a merit that positional information can be obtained therefrom no matter in what position it is. For example, as shown in FIG. 7, an encoder pattern is formed on the rotor in a concentrical manner and thus there is provided the code pattern for reading an angle. The code pattern for reading an angle is made up of two tracks, i.e., a first track 5000 and a second track 6000, and thereby fine and coarse or fine, medium, and coarse code patterns are provided.

Further, as shown in FIG. 8, there are provided a first track illuminating portion 7100 for illuminating the first track 5000, second track illuminating portions 7200, 7200 for illuminating the second track 6000, and a CCD unit 7300 for detecting the encoder pattern. The illuminating portions made up of the first track illuminating portion 7100, the second track illuminating portions 7200, 7200, and the CCD unit 7300 are arranged so as to have the rotor sandwiched in-between. Through such means, it is possible to read the angle in any desired position from the code pattern.

On the other hand, as shown in FIG. 9, the incremental type is made up of a rotor 8510 having a main scale 8511 and an index for zero signal detection 8512 formed thereon, a stator 8520 having a subscale for index 8522 and subscales 8523, 8523 formed thereon, and a detection means 8530 disposed such that the rotor 8510 and the stator 8520 are sandwiched in-between.

The main scale 8511 formed on the rotor 8510 is constituted of a grating with bars, as graduations, disposed at equal pitch on the circumference. The index for zero signal detection 8512 formed on the rotor 8510 serves as the reference point for counting the main scale 8511.

The index for zero signal detection 8512 becomes necessary when a count is made from a specific position and becomes unnecessary when it is made from an arbitrary position.

On a fixed stator 8520, there are disposed the two subscales 8523, 8523 and the subscale for index 8522. The subscales 8523, 8523, which are shorter than the main scale 8511, are constituted of gratings with bars disposed at the same pitch as that of the main scale 8511.

The detection means 8530 is made up of an index detecting portion and a main scale detecting portion. The index detecting portion is made up of a first light emitting device 8531, a first collimator lens 8532, and a first photodetecting device 8533 and it can detect the index for zero detection 8512 formed on the rotor 8510.

The main scale detecting portion is made up of a second light emitting device 8535, a second collimator lens 8536, and a second photodetecting device 8537. The main scale detecting portion detects the light and dark pattern of the main scale 8511 formed on the rotor 8510 as going on and off of light and converts the going on and off of light into an electric signal by means of the second photodetecting device 8537 and, by counting the electric signals, it can measure the angle from the point of zero detection.

More specifically, as the rotor 8510 rotates, going on and off of light is produced every time the main scale 8511 moves one pitch and, then, the second photodetecting device 8537 provides a sinusoidal signal by receiving the going on and off of light.

One of the phases of the sinusoidal waves detected from the two subscales 8523, 8523 is shifted from the other by ¼ pitch. From the phase shift, the rotating direction of the rotor 8510 can be detected.

The sinusoidal signal obtainable from the second photodetecting device 8537 is biased so that detection of an angle finer than that obtained from the pitch of the bars of the grating of the main scale 8511 may be achieved. Further, by increasing sinusoidal waves with the phases arithmetically shifted, finer angle detection than with the pitch of the bars of the grating of the main scale 8511 may become possible.

However, there have been problems with the absolute type in that its structure is complex and making it small and light so as to be incorporated in surveying instruments is extremely difficult.

In the case of the encoder of the incremental type, since it is of a system in which the main scale 8511 formed on the rotor 8510 is read, if, for example, the main scale 8511 is as large as 80 mm or so in diameter and the pitch of the bars of the grating is 60 sec, the number of the bars amounts to 21600 all along the circumference and, therefore, a very fine scale with the pitch being as small as ten-odd μm must be cut for the main scale 8511.

While such a fine scale is produced by projecting a contracted image of an original to a photoresist and subjecting the photoresist to etching, parallelism and uniform thickness of the bar as well as accuracy in the pitch of them constitute great factors affecting stability of the encoder signal.

For example, if such a defect as a deformation of the grating or an irregular pitch in the grating is produced in one of the graduations, a problem arises that the counting becomes difficult or impossible.

Further, since the encoder of the incremental type reads the bars of the main scale 8511 formed on the rotor 8510 one by one, it has such a grave problem that counting becomes impossible when the rotor 8510 is suddenly rotated or given a shock.

SUMMARY OF THE INVENTION

The present invention is a rotary encoder for detecting an angle. The encoder is made up of a rotor and a stator, in which a scale formed on the rotor has a first pattern modulated for a first period and a second pattern modulated for a second period different from the first period. The first pattern and the second pattern are sequentially disposed at equal pitch in the rotating direction of the rotor and there is provided a scale detection means for reading the patterns of the scale. Modulation of the first pattern and the second pattern may be provided by spatial modulation exercised by changing the width of the bars.

BRIEF DESCRIPTION OF THE DRAWINGS

Embodiments of the invention will be described with reference to the drawings, in which:

FIG. 2 (b) is a diagram explanatory of the principle of the encoder 1000 of the embodiment;

DESCRIPTION OF THE INVENTION

An embodiment of the invention will be described with reference to the accompanying drawings.

Figure 1:
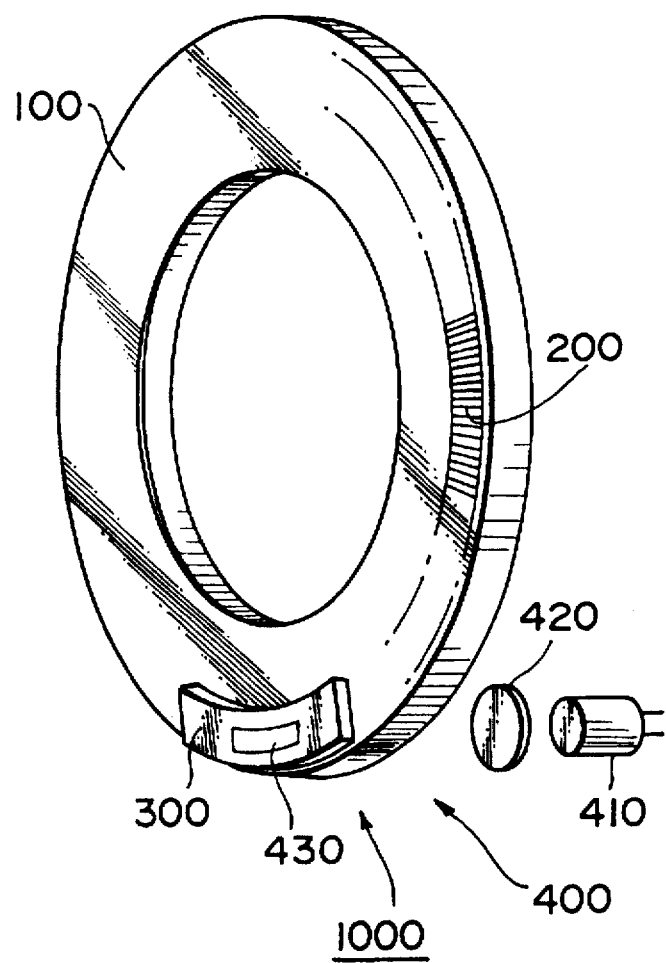
FIG. 1 is a diagram showing a structure of an encoder 1000 of an embodiment of the invention.

Referring to FIG. 1, an encoder 1000 of the embodiment is made up of a rotor 100, a scale 200 formed on the rotor 100, a stator 300, and a scale detection means 400.

The scale 200 formed on the rotor 100 is constituted of spatially modulated patterns, which include at least a first pattern modulated for a first period and a second pattern modulated for a second period different from the first period, and is arranged such that the first pattern and the second pattern are sequentially disposed at equal pitch in the rotating direction.

Namely, in modulating the first pattern and the second pattern, spatial modulation exercised by changing the width of the bars is employed.

The scale detection means 400, made up of a light emitting device 410, a collimator 420, and a linear sensor 430, is disposed so that the rotor 100 and the stator 300 are sandwiched in-between.

The linear sensor 430 is for converting the scale 200 formed on the rotor 100 into an electric signal. The linear sensor 430 is formed on the stator 300 and a CCD linear sensor is employed therefor in the present embodiment. The linear sensor 430 is not limited to the CCD linear sensor but any sensor can be used as long as it is a linear image sensor having such devices as photodiodes disposed in a one-dimensional array.

Figure 3:
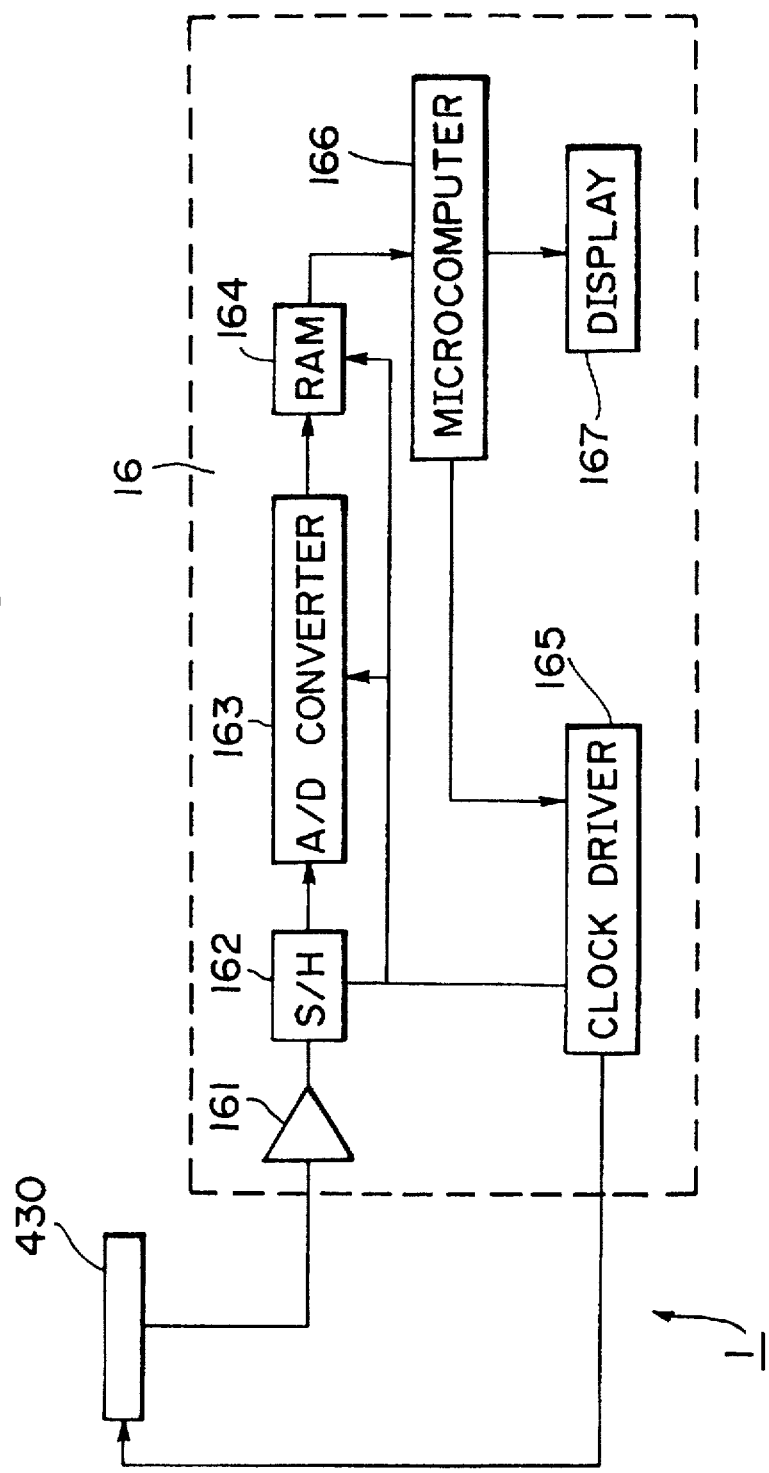
FIG. 3 is a diagram showing an electrical configuration of the embodiment.

Processor means 16, as shown in FIG. 3, is made up of an amplifier 161, a sample and hold 162, an A/D converter 163, a RAM 164, a clock driver 165, a microcomputer 166, and a display 167.

Principle

Now, the scale 200 formed on the rotor 100 and the principle of the measurement of the scale will be described.

Figure 2A:
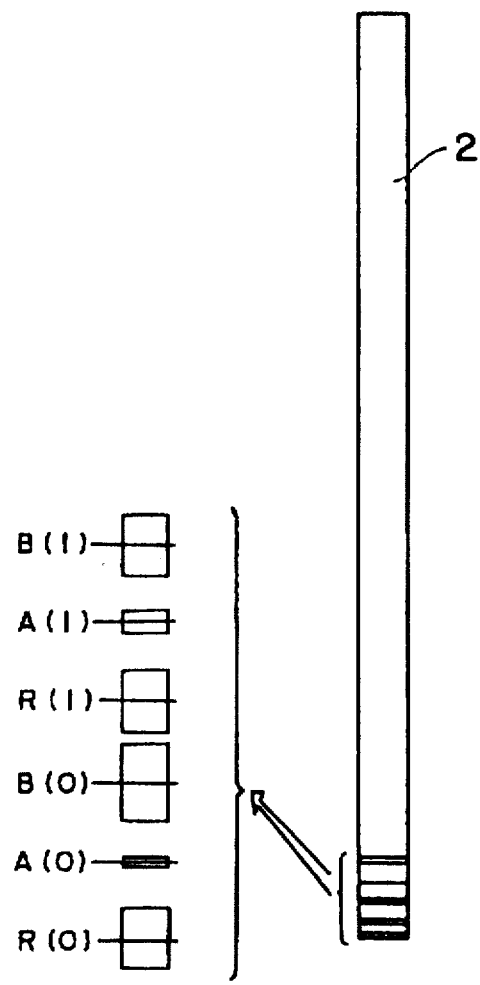
FIG. 2 (a) is a diagram explanatory of the principle of the encoder 1000 of the embodiment.

First, to simplify the explanation, the scale 200 formed on the rotor 100 in a concentrical manner will be developed into a linear representation as shown in FIG. 2(a).

The scale 200 formed concentrically on the rotor 100 as shown in FIG. 2(a) has the first pattern A, the second pattern B, and the third pattern R cyclically disposed at equal pitch (p). More specifically, the three kinds of patterns are treated as one block and such blocks are continuously disposed. If the block disposed on the leftmost side is defined as the block 0 and denoted by R(0), A(0), and B(0), then they are cyclically disposed followed by R(1), A(1), B(1), R(2), A(2), B(2), . . . . Since all the patterns are repeated at equal pitch p, the signal corresponding to the pitch is defined as a reference signal.

Figure 2B:
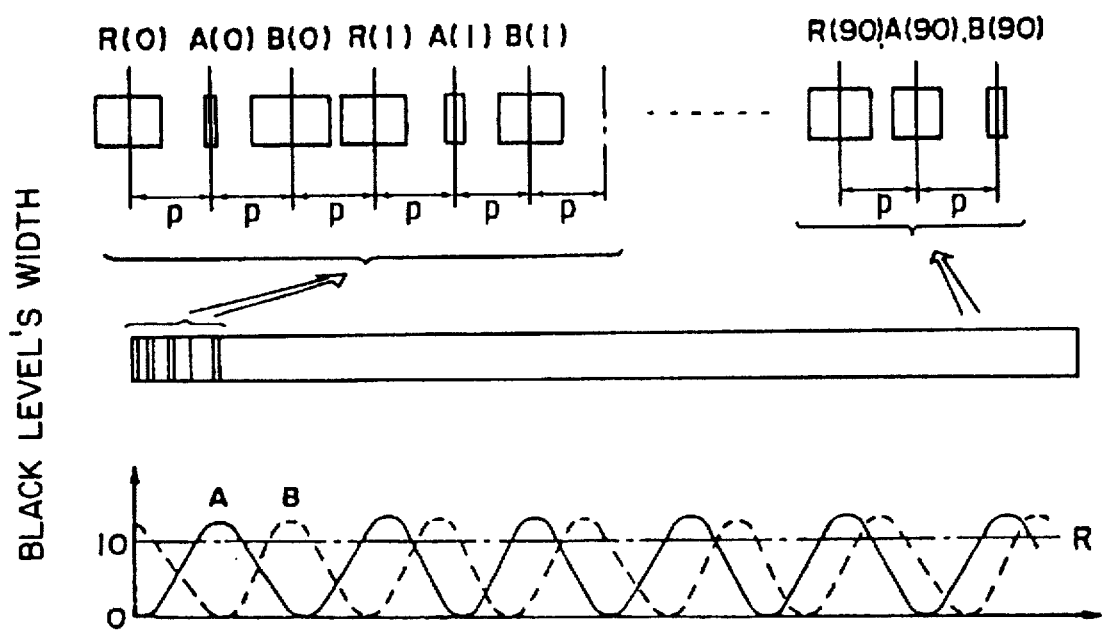

In the present embodiment, while the equal pitch (p) is set, for example, to 183.8 sec (183.8 sec when converted to angle), any value of pitch (pitch angle) can be employed. The third pattern R has a fixed width, the first pattern A has its width of the black portion modulated such that one period is attained at an angle of 360 degrees/50, and the second pattern B has its width of the black portion modulated such that one period is attained at an angle of 360 degrees/47. Any periods can be employed for the first pattern A and the second pattern B provided that the periods are slightly different. The manner of modulation of the first pattern A and the second pattern B is as shown in FIG. 2(b).

Now, the principle of detecting a specific angle from the scale 200 will be described.

Since the first pattern A of the scale 200 formed concentrically on the rotor 100 has its width of the black portion modulated such that one period is attained by an angle of 360 degrees/50, setting the modulated widths at 0–183.8 sec, the width DA of the first pattern is given by $$D_A = 91.9 \sec \times (1 + SIN(2 \times \pi \times X/(1296000 \sec/50))) \quad (1)$$

where X=(183.8 sec, 735.3 sec, 1286.8 sec, . . . ).

Likewise, since the second pattern B of the scale 200 formed concentrically on the rotor 100 has its width of the black portion modulated such that one period is attained by an angle of 27574.5 sec, the width DB of the second pattern is given by $$D_B = 5 \times (1 + SIN(2 \times \pi \times X/(1296000 \sec/47))) \ldots (2)$$

where X=(367.7 sec, 919.1 sec, 1470.6 sec, . . . ).

The third pattern has a fixed width of 147.1 sec being 80% of the maximum modulation of the first and second patterns.

Since the periods of the first pattern A and the second pattern B are slightly different, the same patterns appear when one full rotation, being the least common multiple of them, is made (point of concurrence). Therefore, it follows that the phase difference between the signal according to the first pattern A and the signal according to the second pattern B varies from 0 to $2\pi$ within the range of the one rotation of the rotor 100. Namely, by denoting the phase of the signal according to the first pattern A by $\phi_A$ and the phase of the signal according to the second pattern B by $\phi_B$, the angle $\theta$ of the rotor 100 is given by $$\theta = (\phi_B - \phi_A)/(50-47) \quad (3)$$

The way of calculating the angle $\theta$ of the rotor 100 will be described concretely.

Figure 4:
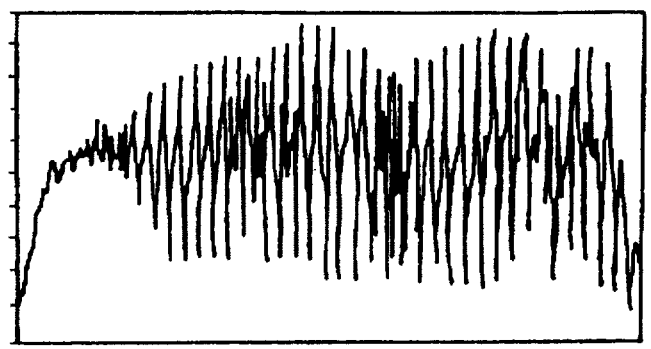
FIG. 4 is a diagram explanatory of the principle of the measurement exercised in the embodiment.
Figure 4:
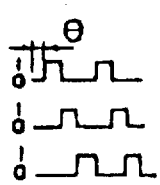
Figure 4:
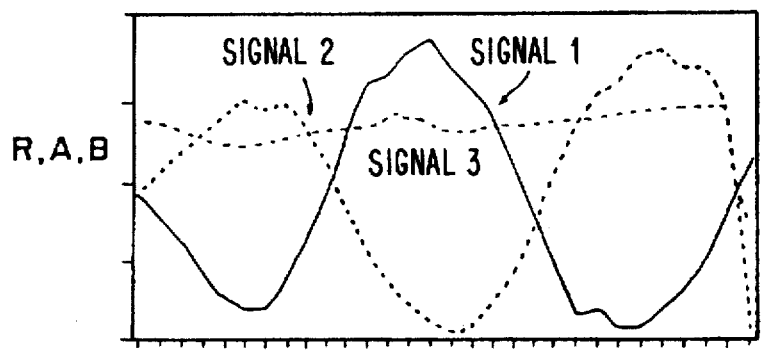

The output signal of the linear sensor 430 is integrated for the front and rear halves of the pitch of the reference signal (the signal corresponding to the equal pitch p). Then, values at every third place of the integrated values are picked out (product detection), and, thereby, a signal 1 corresponding to the first pattern A, a signal 2 corresponding to the second pattern B, and a signal 3 corresponding to the third pattern R are obtained as shown in FIG. 4. Since the third pattern R does not have its width modulated and, in addition, the width of the third pattern R is only 147.1 sec while the first pattern A and the second pattern B have the largest modulated width 183.8 sec, the signal 3 corresponding to the third pattern R has a virtually constant integrated value, being about 80% compared with the signal 1 and the signal 2.

Figure 5:
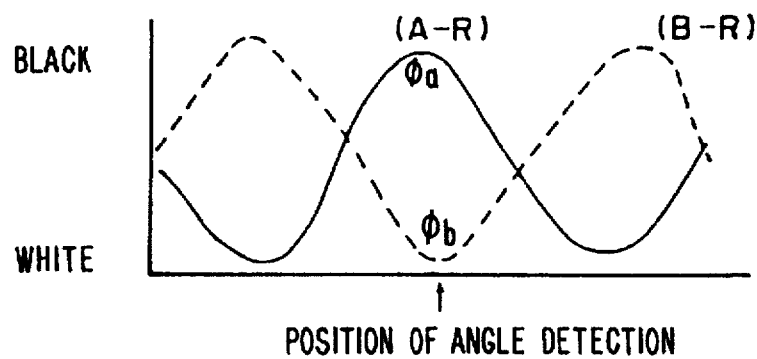
FIG. 5 is a diagram explanatory of the principle of the measurement exercised in the embodiment.

Further, since the third pattern R, the first pattern A, and the second pattern B are cyclically disposed in the predetermined sequence, it can be determined to which of the third pattern R, the first pattern A, and the second pattern B the picked out signal belongs. Furthermore, in order to remove the effect of the external disturbing light producing irregularity in light quantity, signals (A—R) and (B—R) referenced from the signal corresponding to the third pattern R as shown in FIG. 5 are obtained.

Then, by choosing, from the signals (A—R) and (B—R), a set of the signal R, the signal (A—R), and the signal (B—R) including the reference signal including the address position (the m-th bit) of the linear sensor 430 corresponding to the position of angle detection and, then, obtaining the phases of the signals (A—R) and (B—R), it can be found out of which position of the scale 200 formed concentrically on the rotor 100 the chosen set of the first pattern A, the second pattern B, and the third pattern R is.

Here, by denoting the signal (A—R) by Am and the signal (B—R) by Bm and representing ½ of the maximum amplitude of the signal (A—R) by Wa and ½ of the maximum amplitude of the signal (B—R) by Wb, the phases of the signals (A—R) and (B—R) can be respectively obtained from $$\phi_a = \text{SIN}^{-1}(Am/Wa) \quad (6)$$

and $$\phi_b = \text{SIN}^{-1}(BM/Wb) - 2 \times \pi(183.8/(360 \times 60 \times 60/47)) = \text{SIN}^{-1}(Bm/Wb) - 2 \times \pi(183.8/27574.5) \quad (7)$$

The odd sum in Equation 7 is produced by the fact that the position of the signal corresponding to the second pattern B is deviated 183.8 sec from the signal corresponding to the first pattern A.

By substituting Equations 6 and 7 in Equation 3, the position on the scale 200 of the signal corresponding to the first pattern A can be detected and the angle θ of the rotor 100 can be obtained. If the reference signal belongs to the third pattern R, 183.8 sec should be subtracted and if the reference signal belongs to the second pattern B, 183.8 sec should be added. Thus, the position on the scale 200 formed concentrically on the rotor 100 can be detected and the angle θ of the rotor 100 can be obtained.

Now, the processor means 16 installed in the encoder 1000 of the present embodiment will be described in detail.

The amplifier 161 is for amplifying an electric signal from the linear sensor 430, the sample hold 162 is for sampling and holding the amplified electric signal with a timing signal from the clock driver 165, and the A/D converter 163 is for A/D converting the sampled and held electric signal. The RAM 164 is for storing the A/D converted digital signal. Further, the microcomputer 166 is for performing various calculating operations.

Figure 6:
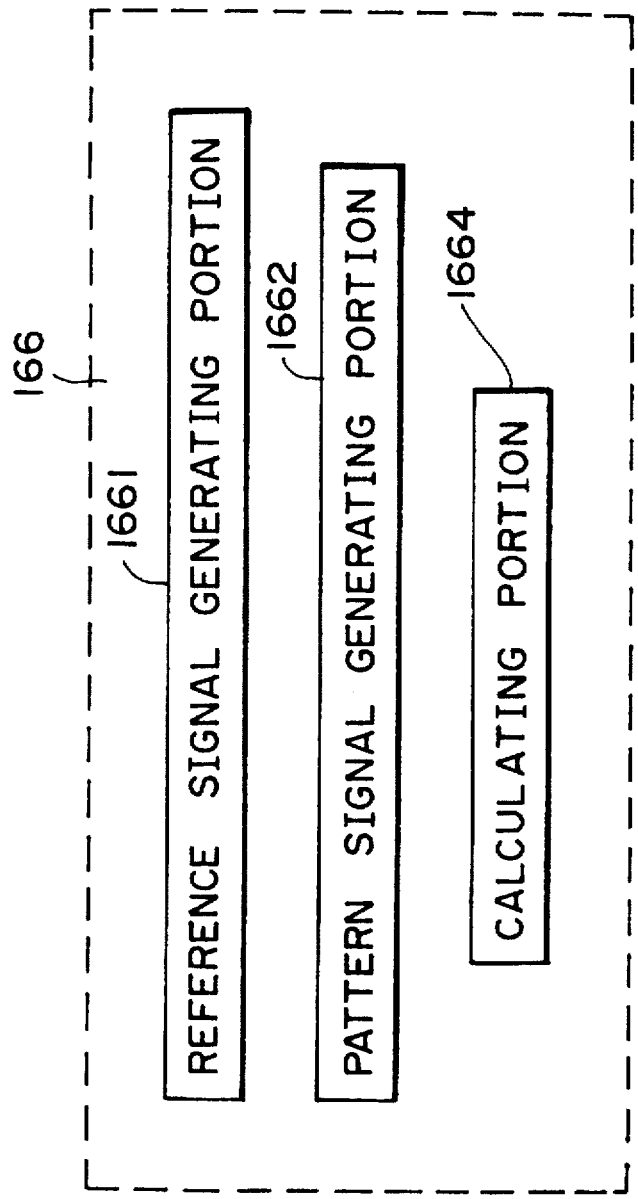
FIG. 6 is a diagram showing a structure of a processor means 16 in the embodiment.
Figure 7:
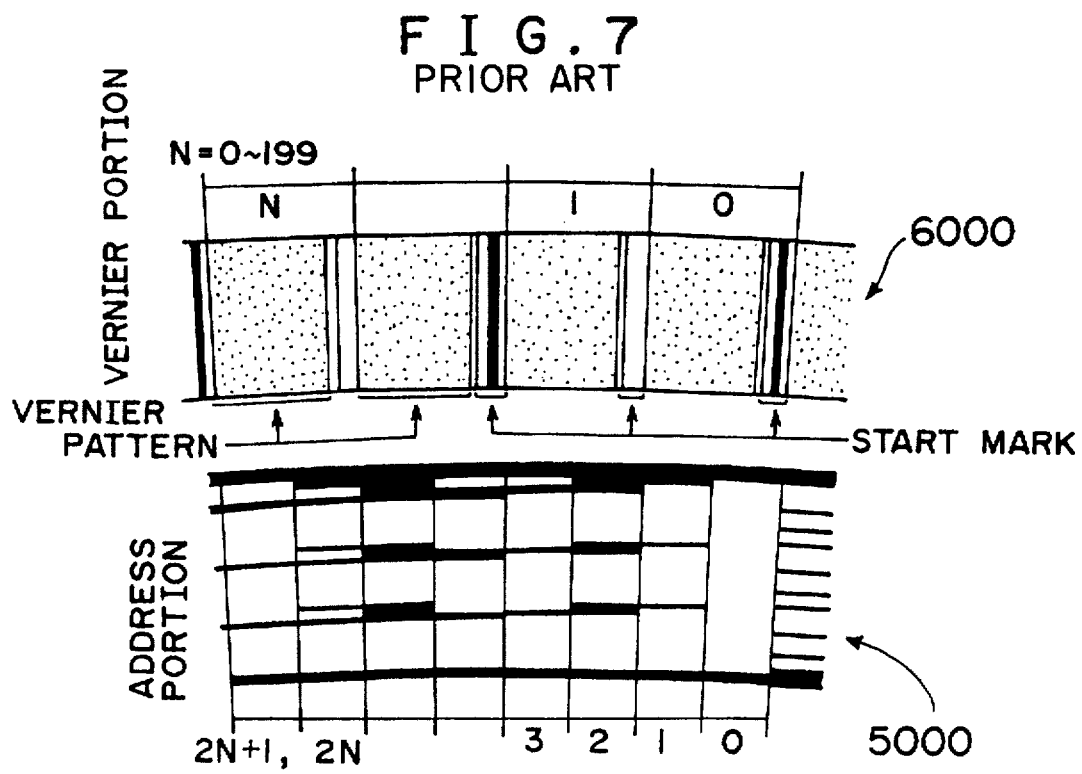
FIG. 7 is a diagram explanatory of a prior art.
Figure 8:
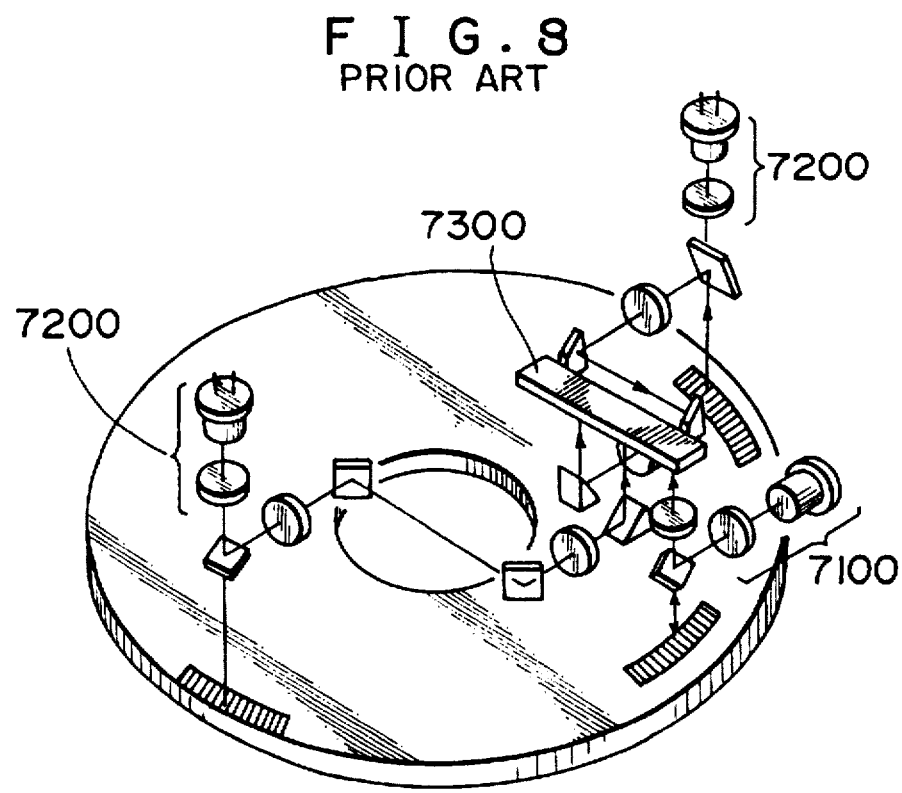
FIG. 8 is a diagram explanatory of a prior art.
Figure 9:
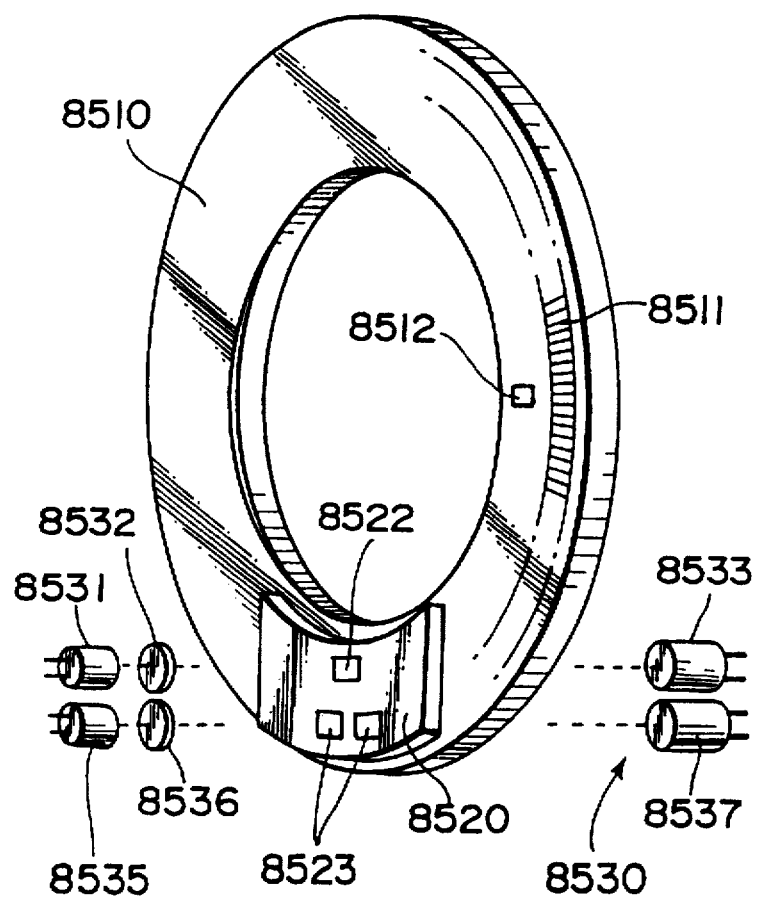
FIG. 9 is a diagram explanatory of a prior art.

Now, the functions performed by the microcomputer 166 will be described with reference to FIG. 6. The microcomputer 166 is made up of a reference signal generating portion 1661, a pattern signal generating portion 1662, and a calculating portion 1664. The reference signal generating portion 1661 generates a reference signal corresponding to the equal pitch p from the electric signal obtained from the linear sensor 430 by means of fast Fourier transform.

The pattern signal generating portion 1662 integrates the signal input thereto for the front and rear halves of the pitch of the reference signal and then picks out values at every third place of the integrated values (product detection) to thereby generate the first pattern signal and the second pattern signal.

The calculating portion 1664 calculates Equation 3 from the phases of the first pattern signal and the second pattern signal to obtain the angle θ of the rotor 100.

The display 167 displays the angle θ of the rotor 100 calculated by the calculating portion 1664, for which a display means such as a liquid crystal display may be used or an external memory means or the like may be used to output the data.

Now, the encoder 1000 of the present embodiment will be described concretely.

The scale 200 formed concentrically on the rotor 100 is constituted of the first pattern A, the second pattern B, and the third pattern R.

The first pattern A is arranged so that its one period is attained by 360 degrees/50 and the second pattern B is arranged so that its one period is attained by 360 degrees/47. Therefore, at the point A=50 periods and B=47 periods, where their least common multiple is attained, the same pattern appears. Namely, this point corresponds to the index for the zero signal.

In the conventional encoder, by setting the pitch of the bars of the grating at around 60 sec, it would be possible to detect an angle to maximum fineness of around 0.2 sec from the signal obtained from the grating.

In the encoder 1000 of the embodiment, the detection is possible to 1/1000 of the bar code pitch. Then, it is known that 0.2 sec×1000 corresponds to 38.78 μm. If pitches are sought from it, 6480 pitches are obtained for one rotation.

From the first pattern A (A=50 periods) and the second pattern B (B=47 periods), the least common multiple of A and B becomes 2350 blocks, and, in the case of three pitches with the third pattern R added, it becomes

2350×3=7050.

One pitch is given by (360×60×60)/7050=183.3 sec and the resolution is given by 183.3 sec×1000=0.18 sec.

The present invention constructed as described above is made up of a rotor and a stator. A scale formed on the rotor has a first pattern modulated for a first period and a second pattern modulated for a second period different from the first period and the first pattern and the second pattern are sequentially disposed at equal pitch in the rotating direction of the rotor, and, further, there is provided a scale detection means for reading the patterns of the scale.

In the invention, the modulation of the first pattern and the second pattern may be made by spatial modulation exercised by changing the width of the bars.

Further, the invention may have a uniform third pattern in addition to the first pattern and the second pattern and may dispose the first pattern, the second pattern, and the third pattern sequentially in the rotating direction of the rotor at equal pitch.

Further, in the present invention, the scale formed on the rotor has a first pattern modulated for a first period and a second pattern modulated for a second period different from the first period , the first pattern and the second pattern are sequentially disposed at equal pitch in the rotating direction of the rotor, and it is adapted such that a scale detection means reads the patterns of the scale and a processor means calculate s the angle of the rotor on the basis of the detected signal by the scale detection means, and it is made possible that a reference signal generating portion of the processor means generates a reference signal from the pitch of the detection signal detected by the scale detection means, a pattern signal generating portion generates a first pattern signal and a second pattern signal from the reference signal generated by the reference signal generating portion and the detection signal detected by the scale detection means, and the calculating portion calculates the angle of the rotor from the phase of the first pattern signal and the phase of the second pattern signal. Accordingly, it is not necessary to make the grating so fine as in the conventional encoders of the incremental type and to detect the edge portion of the bar of the grating, and therefore a merit can be obtained that the encoder can be manufactured with ease and at low cost.

In the invention, the first pattern and the second pattern may have at least one point where they concur with each other with respect to their phases.

Further, the invention has such a good effect that it makes measurement of the phase difference possible no matter in which position the rotor may be and makes the detection of an angle possible only by detecting the linear scale on the stator.

Therefore, it follows that the rotary encoder of the invention has the merits of the incremental type and the absolute type at the same time and has such an excellent feature that it provides an encoder having high added value and high marketability.

What is claimed is:

1. In an encoder made up of a rotor and a stator, a rotary encoder comprising:

a scale formed on said rotor and having a first pattern modulated for a first period and a second pattern modulated for a second period different from the first period, said first pattern and said second pattern being sequentially disposed at equal pitch in the rotating direction of said rotor, and scale detection means for reading the patterns of said scale, wherein said first pattern and said second pattern have at least one point of concurrence where said patterns concur with each other with respect to phases thereof.

2. A rotary encoder according to claim 1, further comprising a uniform third pattern, said first pattern, second pattern, and third pattern being sequentially disposed at equal pitch in the rotating direction of said rotor.

3. A rotary encoder according to claim 1, wherein modulation of said first pattern and said second pattern is made by spatial modulation exercised by changing the width of bars of the patterns.

4. A rotary encoder according to claim 3, further comprising a uniform third pattern, said first pattern, second pattern, and third pattern being sequentially disposed at equal pitch in the rotating direction of said rotor.

5. In an encoder made up of a rotor and a stator, a rotary encoder comprising:

a scale formed on said rotor having a first pattern modulated for a first period and a second pattern modulated for a second period different from the first period, the first pattern and the second pattern being sequentially disposed at equal pitch in the rotating direction of said rotor;

scale detection means for reading the patterns of said scale; and processor means for calculating the angle of said rotor on the basis of a signal detected by said scale detection means, said processor means including a reference signal generating portion for generating a reference signal from the pitch of a detection signal detected by said scale detection means, a pattern signal generating portion for generating a signal of said first pattern and a signal of said second pattern from the reference signal generated by said reference signal generating portion and the detection signal detected by said scale detection means, and a calculating portion for calculating the angle of said rotor from the phase of said first pattern signal and the phase of said second pattern signal.

6. A rotary encoder according to claim 5, wherein said first pattern and said second pattern have at least one point of concurrence where said patterns concur with each other with respect to phases thereof.

7. In an encoder made up of a rotor and a stator, a rotary encoder comprising:

a scale formed on said rotor having a first pattern and a second pattern being sequentially disposed at equal pitch; and scale detection means for reading the patterns of said scale;

said first pattern being modulated for a first period and said second pattern being modulated for a second period by changing first and second pattern widths.

8. A rotary encoder according to claim 7, wherein said first pattern and said second pattern are modulated by a different period.

9. A rotary encoder according to claim 7, further comprising a processor to measure a position of the rotor by a phase difference between said first pattern and said second pattern.

10. A rotary encoder according to claim 7, said scale comprising said first pattern and said second pattern and further comprising a third pattern having uniform width, said first pattern, said second pattern and said third pattern being sequentially disposed at equal pitch in a rotating direction of said rotor.

11. A rotary encoder according to claim 7, further comprising a processor to form a reference signal to obtain pattern signals by means of fast Fourier transform of patterns.

12. A rotary encoder according to claim 7, wherein said first pattern and said second pattern have at least one concurrence point for the first period and second period periodically.

13. A rotary encoder according to claim 12, further comprising a processor to measure a position of the rotor by a phase difference between said first pattern and said second pattern.

14. A rotary encoder according to claim 12, wherein said periodical concurrence point is an index for a zero signal.

15. In an encoder made up of a rotor and a stator, a rotary encoder comprising:

a scale formed on said rotor having patterns concentrically at equal pitch, and scale detecting means for reading the patterns of the scale, said scale including plural patterns, said scale disposing said plural patterns repeatedly as a set and wherein each of said plural patterns modulates with a different period by changing pattern width.

16. In an encoder made up of a rotor and a stator, a rotary encoder comprising:

a scale formed on said rotor having a first pattern and a second pattern being sequentially disposed at equal pitch; and a detector to read the patterns of said scale;

said first pattern being modulated for a first period and said second pattern being modulated for a second period by changing first and second pattern widths.

* * * * *